United States Patent
Lim et al.

(10) Patent No.: US 11,562,954 B2
(45) Date of Patent: Jan. 24, 2023

(54) FRAME-ARRAY INTERCONNECTS FOR INTEGRATED-CIRCUIT PACKAGES

(71) Applicant: Intel Corporation, Santa Clara, CA (US)

(72) Inventors: Seok Ling Lim, Kulim (MY); Jenny Shio Yin Ong, Bayan Lepas (MY); Bok Eng Cheah, Bukit Gambir (MY); Jackson Chung Peng Kong, Tanjung Tokong (MY)

(73) Assignee: Intel Corporation, Santa Clara, CA (US)

( * ) Notice: Subject to any disclaimer, the term of this patent is extended or adjusted under 35 U.S.C. 154(b) by 167 days.

(21) Appl. No.: 16/912,619

(22) Filed: Jun. 25, 2020

(65) Prior Publication Data
US 2021/0066185 A1     Mar. 4, 2021

(30) Foreign Application Priority Data
Aug. 30, 2019   (MY) .......................... PI 2019004996

(51) Int. Cl.
| | |
|---|---|
| *H01L 29/00* | (2006.01) |
| *H01L 29/76* | (2006.01) |
| *H01L 23/522* | (2006.01) |
| *H01L 23/528* | (2006.01) |
| *H01L 21/768* | (2006.01) |

(52) U.S. Cl.
CPC .... *H01L 23/5223* (2013.01); *H01L 21/76838* (2013.01); *H01L 23/5283* (2013.01)

(58) Field of Classification Search
CPC .......... H01L 23/5223; H01L 21/76838; H01L 23/5283; H01L 23/49816; H01L 25/0655; H01L 25/0657; H01L 23/5389; H01L 25/16; H01L 25/50; H01L 23/5384; H01L 2224/16145; H01L 2224/16146; H01L 2224/16227; H01L 2224/17181; H01L 2924/15311; H01L 2924/15331; H01L 2924/18161; H01L 2924/19105; H01L 23/50; H01L 25/105; H01L 23/49811; H01L 24/00
USPC ........................................................ 257/532
See application file for complete search history.

(56) References Cited

U.S. PATENT DOCUMENTS

| | | | |
|---|---|---|---|
| 8,315,035 B2* | 11/2012 | Togashi ................... | H01G 4/30 361/321.1 |
| 2020/0006247 A1* | 1/2020 | Ong ..................... | H01L 23/5226 |

* cited by examiner

*Primary Examiner* — Theresa T Doan
(74) *Attorney, Agent, or Firm* — Schwegman Lundberg & Woessner, P.A.

(57) ABSTRACT

Disclosed embodiments include frame-array interconnects that have a ledge portion to accommodate a passive device. A seated passive device is between at least two frame-array interconnects for semiconductor package-integrated decoupling capacitors.

17 Claims, 9 Drawing Sheets

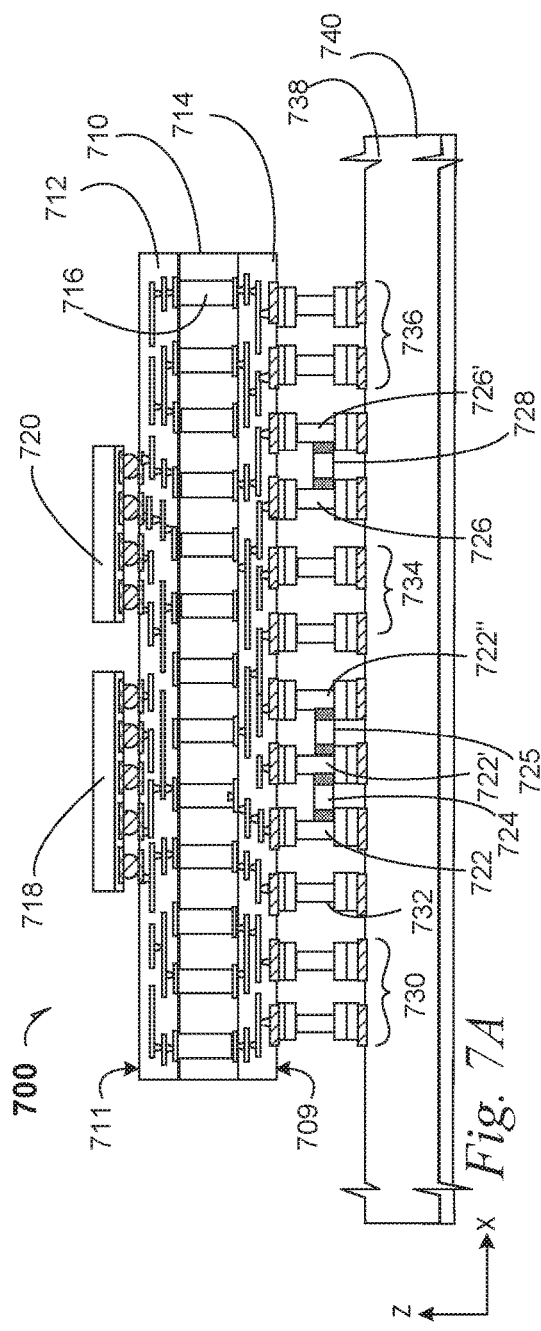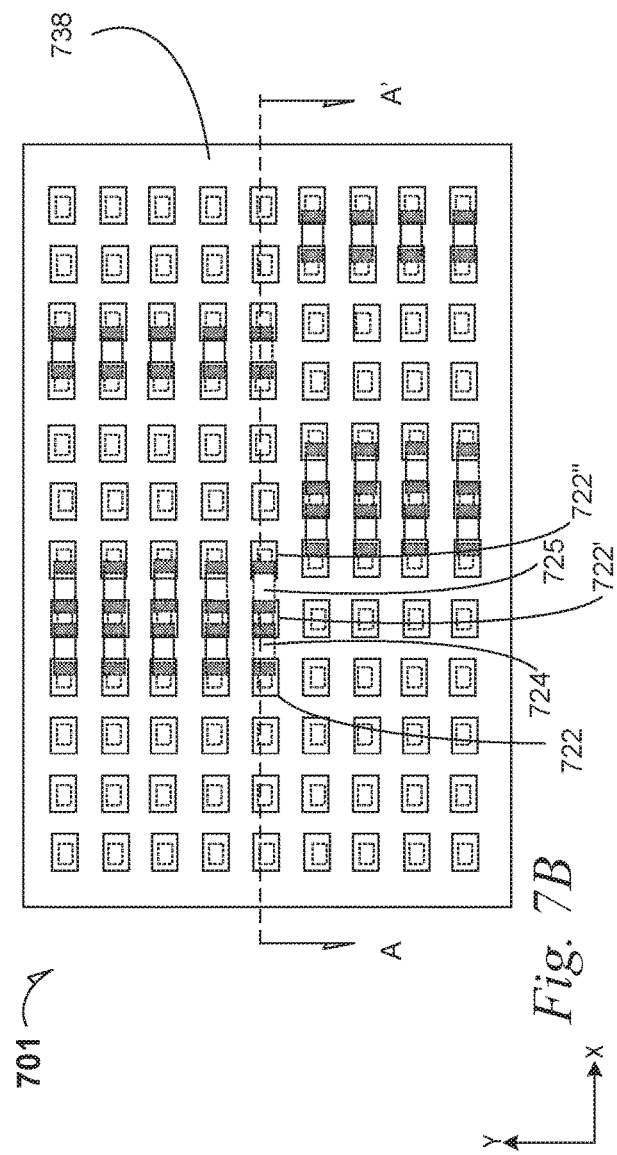

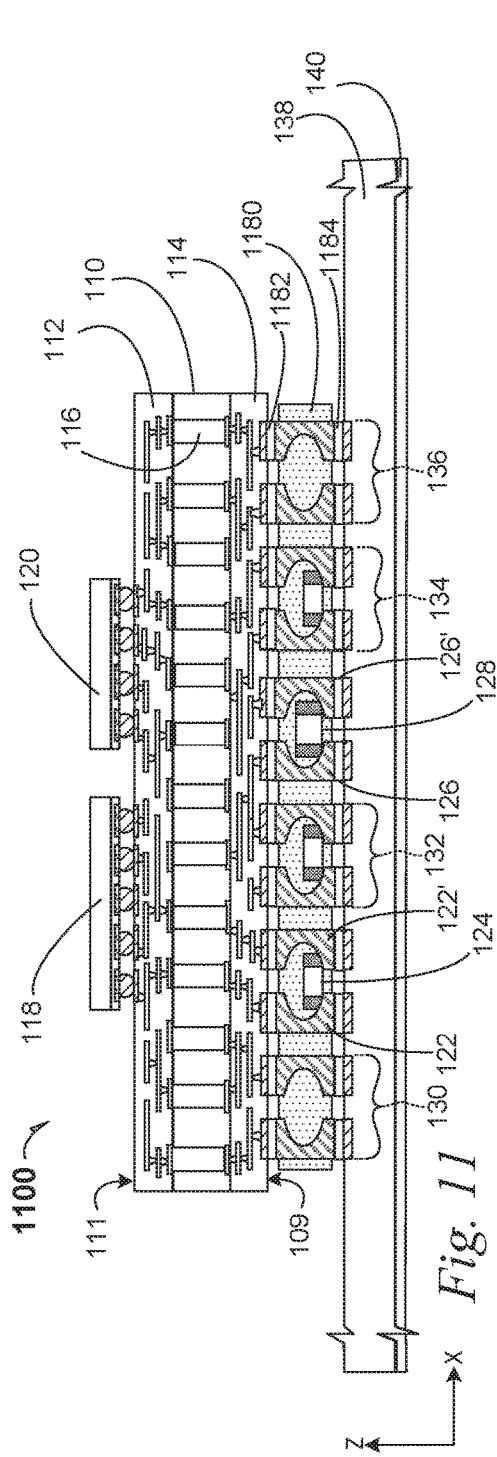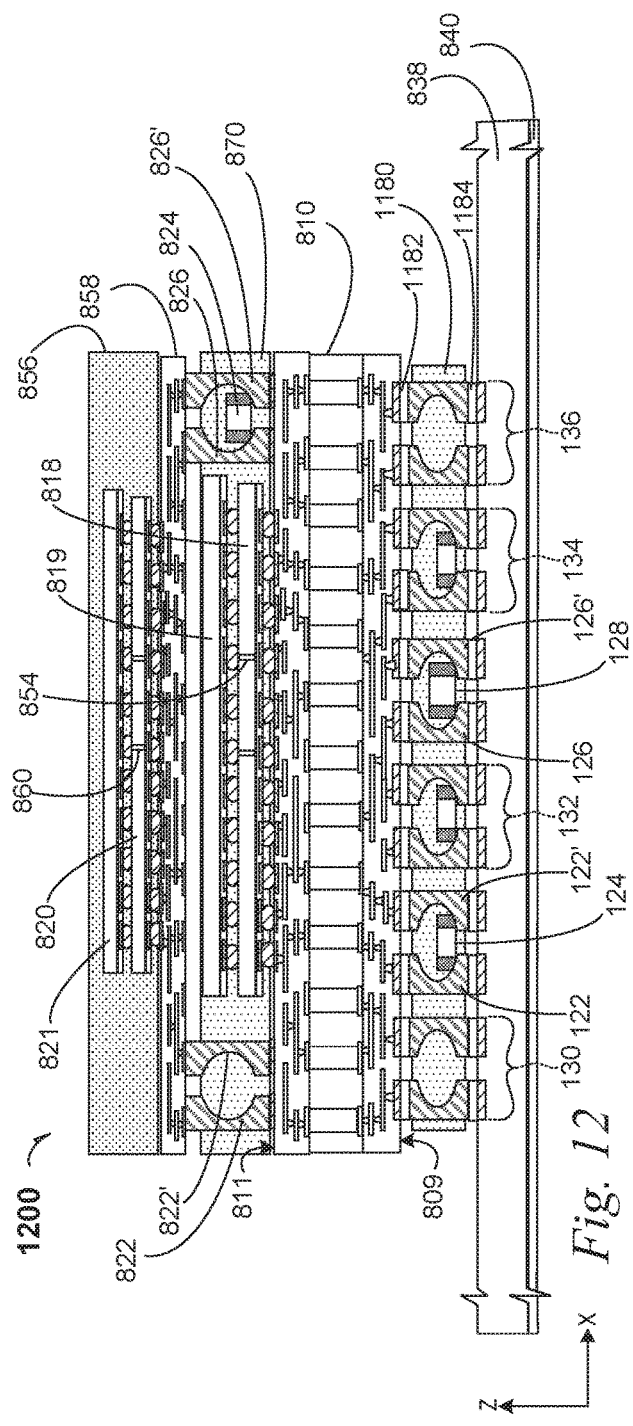

FRAME-ARRAY INTERCONNECTS FOR INTEGRATED-CIRCUIT PACKAGES

PRIORITY APPLICATION

This application claims the benefit of priority to Malaysian Application Serial Number PI 2019004996, filed Aug. 30, 2019, which is incorporated herein by reference in its entirety.

FIELD

This disclosure relates to power and signal delivery for integrated-circuit device packages.

BACKGROUND

Integrated-circuit chip miniaturization connected to device packaging, includes challenges to fit sufficient passive devices near semiconductive devices, while competing for both vertical and lateral space on semiconductor package substrates.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 7A is a cross-section elevation of an integrated-circuit package apparatus that employs I-frame grid array interconnect according to an embodiment;

FIG. 7B is a top plan cut-away of the integrated-circuit package apparatus depicted in FIG. 7A according to an embodiment;

FIG. 11 is a cross-section elevation of an integrated-circuit package apparatus that is similar to the integrated-circuit package apparatus depicted in FIG. 1A according to an embodiment; and FIG. 12 is a cross-section elevation of an integrated-circuit package apparatus that includes elements of the package-on-package apparatus depicted in FIG. 8, and the integrated-circuit package depicted in FIG. 11 according to an embodiment.

DETAILED DESCRIPTION

Disclosed embodiments include frame-array interconnects, between at least two of which passive devices are seated to facilitate small power-delivery loop inductance, while providing proximity advantages for decoupling capacitors and smaller package footprints. Frame-array interconnects can take the place of ball-grid array interconnects, between a land side of an integrated-circuit package substrate and a board such as a motherboard.

Figure 1B:
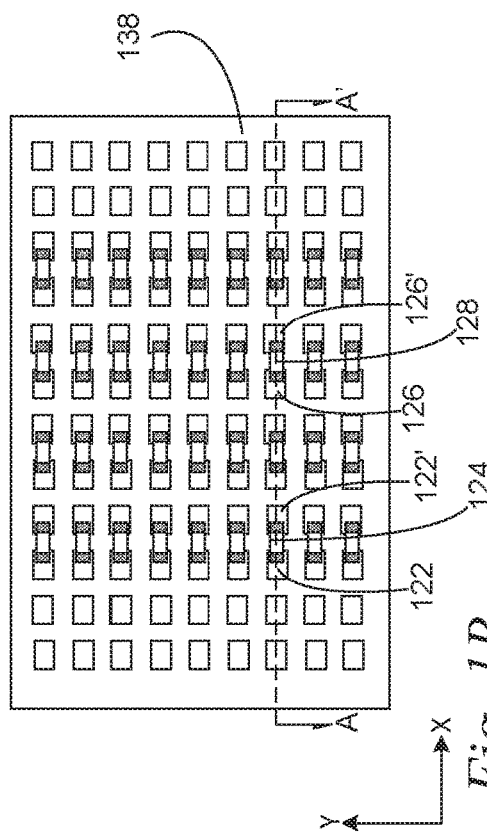
FIG. 1B is a top plan cut-away of the integrated-circuit package apparatus depicted in FIG. 1A according to an embodiment.
Figure 1C:
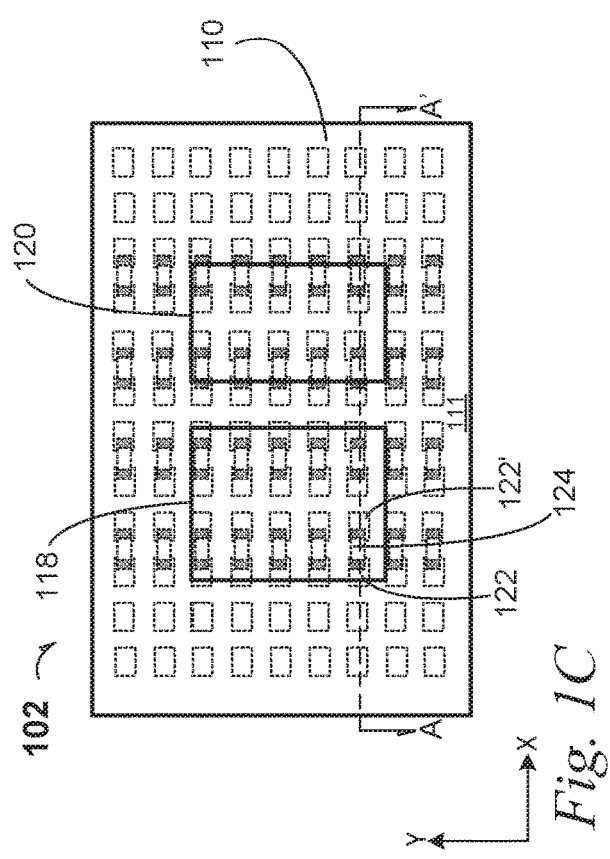
FIG. 1C is a top plan of the integrated-circuit package apparatus depicted in FIG. 1A according to an embodiment.
Figure 1A:
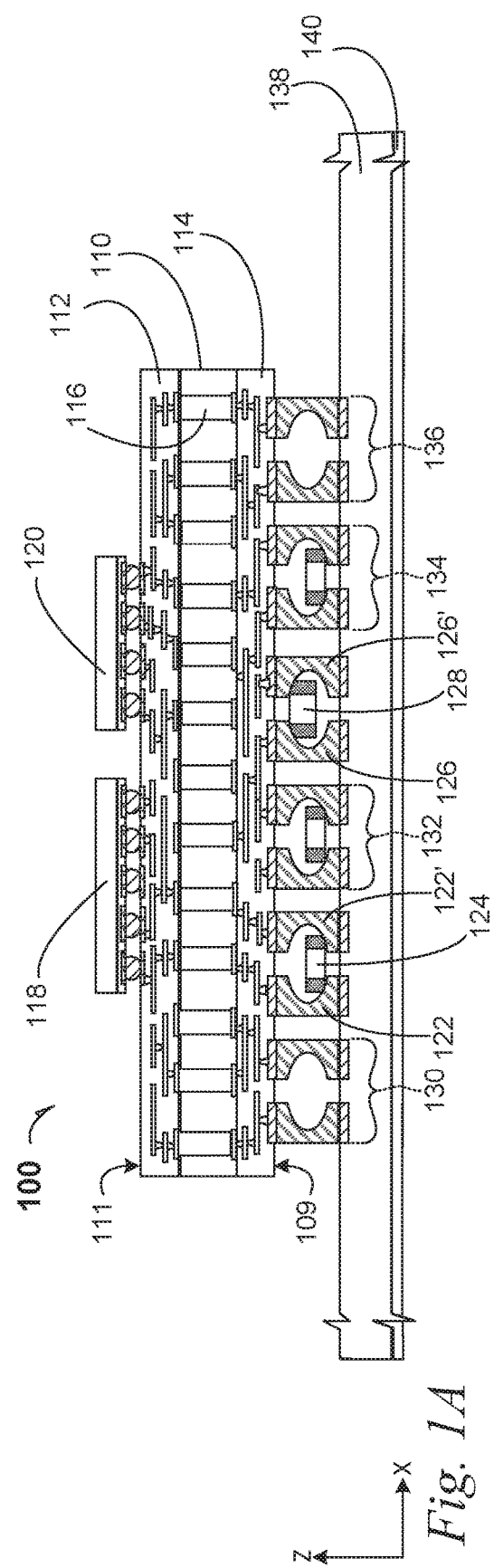
FIG. 1A is a cross-section elevation of an integrated-circuit package apparatus according to an embodiment.

FIG. 1A is a cross-section elevation of an integrated-circuit package apparatus 100 according to an embodiment. An integrated-circuit (IC) package substrate 110 includes a die side 111 and a land side 109. The IC package substrate 110 includes a die-side redistribution layer (RDL) 112 and a land-side RDL 114, as well as through-core interconnects 116 according to an embodiment. At least one of a first integrated-circuit (IC) device 118 and a subsequent IC device 120 are mounted on the die side 111. In an embodiment, and IC device may be referred to as a semiconductive chip, an integrated-circuit chip, or merely a chip where integrated circuits are assembled.

In an embodiment, a first frame-array interconnect (FAI) includes two electrode elements 122 and 122'. The two electrode elements may be referred to as a first frame-array interconnect element 122 and a complementary first frame-array interconnect element 122', as the electrodes form a complementary assembly to accommodate a passive device within the array, and in some embodiments, located directly below active devices that are on the die side 111. A passive device 124 such as a first capacitor 124 is seated within the frame-array interconnects 122 and 122', and the first capacitor 124 is coupled through the integrated-circuit package substrate 110 to at least one of the first IC device 118 and the subsequent IC device 120.

In an embodiment, a subsequent frame-array interconnect includes two electrode elements 126 and 126', and a passive device 128 such as a subsequent capacitor 128 is seated within a cavity formed between the subsequent frame-array interconnect 126 and the complementary subsequent interconnect 126'. The subsequent capacitor 128 is coupled through the integrated-circuit package substrate 110 to at least one of the first IC device 118 and the subsequent IC device 120.

As illustrated, more frame-array interconnects are present in contact with the land side 109 of the IC package substrate 110. For example a third frame-array interconnect 130 including third and complementary third FAIs, and fourth, fifth and sixth FAIs, 132, 134 and 136, respectively. As illustrated the first, subsequent, fourth and fifth FAIs 122 and 122', 126 and 126', 132 and 134, accommodate passive devices such as capacitors.

In an embodiment, the land side 109 faces a board 138 such as a motherboard in a computing system, and the several FAIs contact both the land side 109 and the board 138. In an embodiment, the board 138 has an external shell 140 that provides at least one of physical and electrical insulative protection for components on the board 138. For example, the external shell 140 may be part of a hand-held computing system such as a communication device. In an embodiment, the external shell 140 is part of the exterior of a mobile computing platform such as a drone.

The respective first and complementary first frame-array interconnects 122 and 122' are coupled respectively, to ground and power, and current flow, and a concomitant inductive loop seriatim passes through the structures 122', 124 and 122. According to this embodiment, an abbreviated inductive loop avoids passing through the board 138.

In an embodiment, respective subsequent and complementary subsequent frame-array interconnects 126 and 126' are coupled respectively, to ground and power, and current flow, and a concomitant inductive loop passes seriatim through the structures 126', 128 and 126. As the passive device 128 is mounted at the top of the cavity formed by the respective subsequent and complementary subsequent array interconnects 126 and 126', the current loop can be smaller than that experienced through the structures 122, 124 and 122'. According to this embodiment, a second-degree abbreviated inductive loop 126', 128 and 126 also avoids passing through the board, as well as a first-degree abbreviated inductive loop that passes through structures 122, 124 and 122', where the second-degree abbreviated inductive loop is smaller than the first-degree abbreviated inductive loop.

FIG. 1B is a top plan cut-away 101 of the integrated-circuit package apparatus 100 depicted in FIG. 1A according to an embodiment. The integrated-circuit package apparatus 101 is viewable in FIG. 1A from the section line A-A' in FIG. 1B. As illustrated, the board 138 is a seat for the FAIs, the first and complementary first FAIs 122 and 122' as well as the first passive device 124 are enumerated. As illustrated, the first FAI 122 and the complementary first FAI 122' are part of a plurality of FAIs that are arranged in a rectangular grid on the land side 109 (see FIG. 1A) as well as on the board 138. As illustrated by way of non-limiting example, the FAIs are arranged in a 12-column-by-nine-row rectangular grid layout. The 12×9 grid layout is exemplary, however, and the rectangular layout may be larger or smaller when useful. Further the aspect ratio of 12×9 is one exemplary embodiment and different aspect ratios may also be useful.

FIG. 1C is a top plan 102 of the integrated-circuit package apparatus 100 depicted in FIG. 1A according to an embodiment. The integrated-circuit package apparatus 102 is viewable in FIG. 1A from the section line A-A' in FIG. 1C. As illustrated, the IC package substrate 110 is a top seat for the FAIs (depicted in ghosted lines), the first and complementary first FAIs 122 and 122' as well as the first passive device 124 are enumerated. The first and subsequent IC devices 118 and 120 are seated on the die side 111 of the IC package substrate 110.

Figure 2:
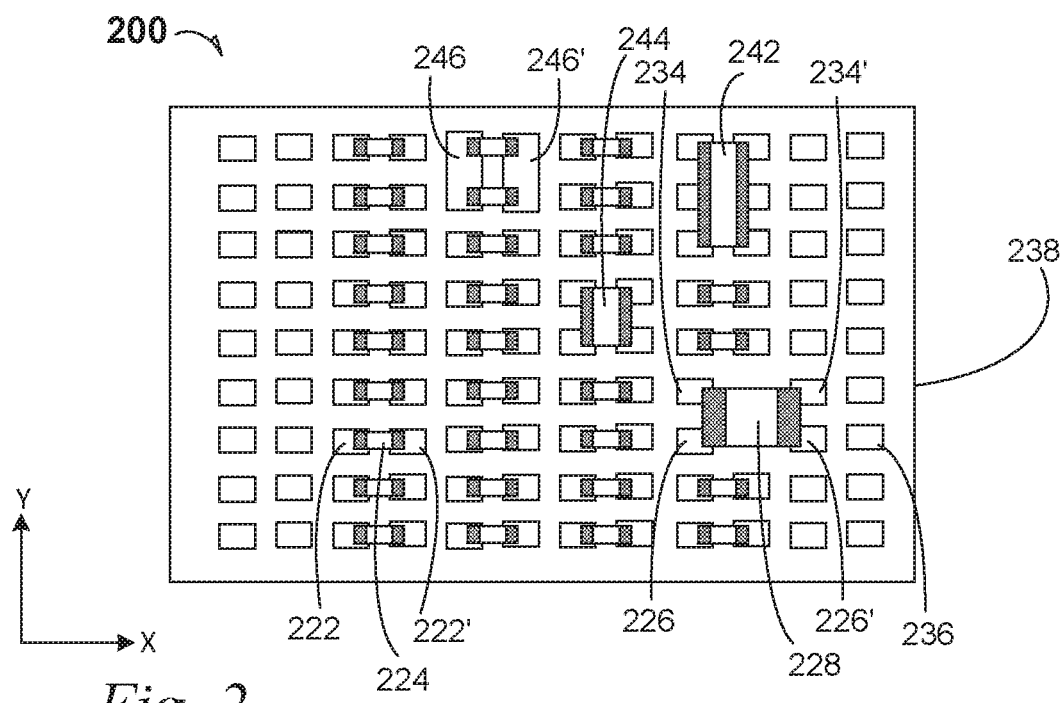
FIG. 2 is a top plan cut-away of an integrated-circuit package apparatus similar to that depicted in FIG. 1B according to an embodiment.

FIG. 2 is a top plan cut-away 200 of an integrated-circuit package apparatus 200 similar to that depicted in FIG. 1B according to an embodiment. As illustrated, a board 238 is a seat for FAIs, including a first and complementary first FAI 222 and 222' as well as a first passive device 224 are enumerated. Because of the footprint and placing of a subsequent passive device 228 between respective subsequent and complementary subsequent devices 226 and 226', one FAI 236 is orphaned with respect to usefulness for accommodating a passive device between two FAIs.

In an embodiment, the subsequent passive device 228 has a larger footprint than the first passive 224, and the subsequent passive device is seated on FAIs 226, 226', 234 and 234'. Whereas the several passive devices depicted in FIG. 1B have the approximate same X-Y footprint, the subsequent passive device 228 requires four FAI elements. In an embodiment, an elongated passive device 242, bridges between six FAI elements. In an embodiment, an elongated passive device 244, bridges between four FAI elements.

In an embodiment, fabrication of the FAIs can include ganged FAIs 246 and 246' to couple two passive devices. In an embodiment, a single passive device is seated and connected to the ganged FAIs 246 and 246'.

Figure 3:
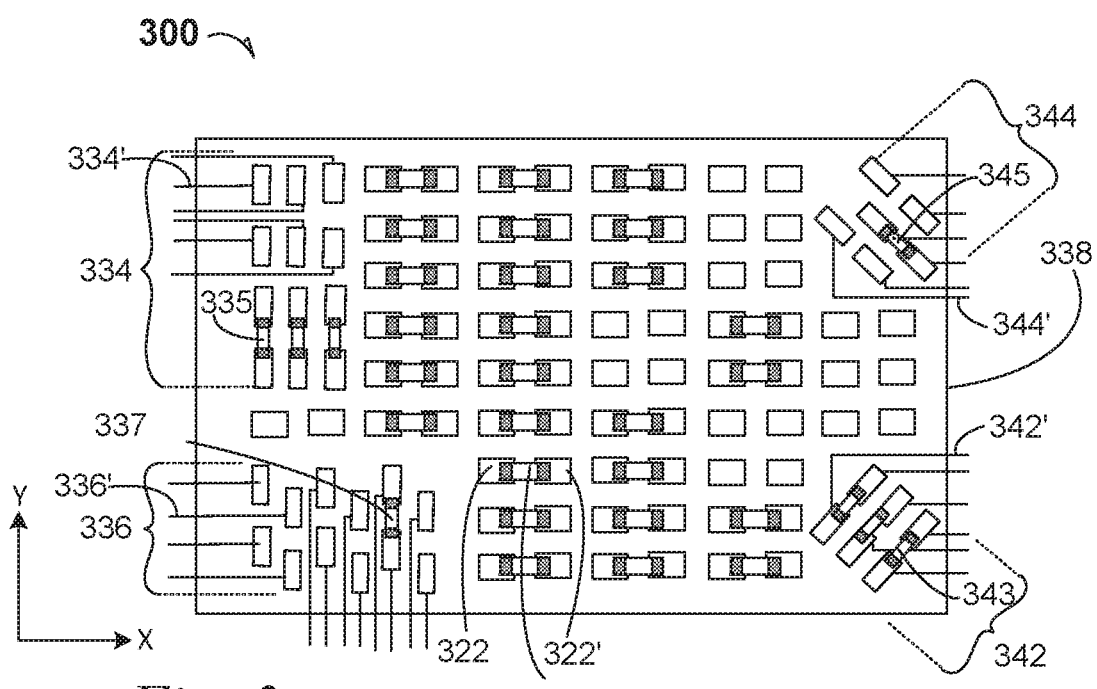
FIG. 3 is a top plan cut-away of an integrated-circuit package apparatus according to an embodiment.

FIG. 3 is a top plan cut-away 300 of an integrated-circuit package apparatus 300 according to an embodiment. The integrated-circuit package apparatus 300 is similarly situated with respect to that depicted in FIG. 2, with different application-specific frame-array interconnect clusters according to several embodiments.

As illustrated, a board 338 is a seat for several FAIs, including application-specific FAI clusters. One FAI cluster has an X-Y orientation, including the FAI elements 322 and 322'. Most of the FAIs share the same X-Y orientation as the FAI elements 322 and 322'. Several FAI elements that share the same X-Y orientation as the FAI elements 322 and 322', accommodate passive devices, such as the FAI elements 322 and 322' accommodate a capacitor 324 seated on the FAI elements 322 and 322'.

A first application-specific FAI cluster 334 is configured orthogonally to the plurality or majority of FAIs, such as the FAI elements 322 and 322'. Consequently, this application-specific FAI cluster 334 is an orthogonal application-specific FAI cluster 334. As illustrated, three orthogonal rows (running in the X-direction) in four orthogonal columns (running in the Y-direction) make up the first orthogonal application-specific FAI cluster 334. At least one passive device 335 couples two orthogonal FAIs within the first application-specific FAI cluster 334.

A first staggered application-specific FAI cluster 336 is configured orthogonally to the plurality of majority of FAIs, such as the FAI elements 322 and 322'. Consequently, it is a first staggered orthogonal application-specific FAI cluster 336. As illustrated, six staggered orthogonal rows (running in the X-direction) in two staggered orthogonal columns (running in the Y-direction) make up the first, staggered application-specific FAI cluster 336. At least one passive device 337 couples two of the staggered, orthogonal FAIs within the first staggered, orthogonal application-specific FAI cluster 336.

A first oblique application-specific FAI cluster 342 is configured at a non-orthogonal angle, such as rotated to 135° relative to the X-Y orientation of the plurality or majority of FAIs, such as the FAI elements 322 and 322'. Consequently, it is an oblique application-specific FAI cluster 342. As illustrated, three oblique rows in two oblique columns make up the first oblique FAI cluster 342. At least one passive device 343 couples two oblique FAIs within the first oblique application-specific FAI cluster 342.

A first, staggered oblique application-specific FAI cluster 344 is configured at a non-orthogonal angle, such as rotated to 45° to the plurality or majority of FAIs, such as the FAI elements 322 and 322'. Consequently, it is a first staggered, oblique application-specific FGA cluster 344. As illustrated, three staggered, oblique rows in two staggered, oblique columns make up the subsequent oblique FAI cluster 344. At least one passive device 345 couples two staggered, oblique FAIs within the first, staggered oblique application-specific FAI cluster 344.

In an embodiment, interconnecting traces that emanate from the several FAI clusters, allow for decongestion trace layout. For example, traces emanating from the first application-specific FAI cluster 334 include six traces (one indicated at 334') that extend from the several frame-array interconnects, and breach a penultimate perimeter of the board 338 for illustrative purposes. Further for example, interconnecting traces that emanate from the subsequent, staggered application-specific FAI cluster 336, include four traces (one indicated at 336') that breach a penultimate perimeter of the board 338 to the left, and eight traces that breach the perimeter at the bottom. Further in an example, interconnecting traces that emanate from the first oblique application-specific FAI cluster 342, include six traces (one indicated at 342') that breach the perimeter laterally from the board 338 to the right. And in an example, interconnecting traces that emanate from the subsequent, staggered oblique application-specific FAI cluster 344, include six traces (one indicated at 344') that breach the perimeter laterally from the board 338 to the right.

Figure 4:
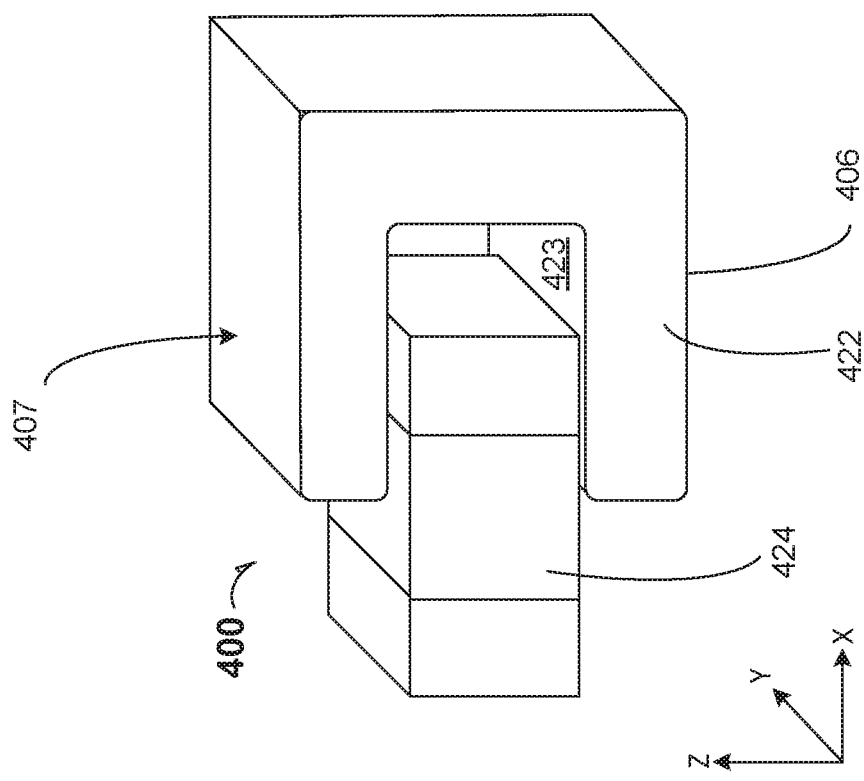
FIG. 4 is a perspective elevation of a frame-array interconnect element and passive device seated on the frame-array interconnect element according to an embodiment.

FIG. 4 is a perspective elevation 400 of a frame-array interconnect element 422 and passive device 424 seated on the frame-array interconnect element 422 according to an embodiment. An FAI element 422 is fashioned into a C-shape, from electronics-grade metal such as copper or aluminum, and a capacitor 424 is seated on a ledge portion 423. In other embodiments, the FAI element 422 contains gold metal. In other embodiments, the FAI element 422 contains an alloy of any above-indicated materials. The FAI element 422 includes a land-side contact surface 407 such as for contacting the land side 109 of the integrated-circuit package substrate 110 in FIG. 1A, and a board-side contact surface 406 such as for contacting the board 138 also as depicted in FIG. 1A. The ledge portion 423 is vertically (Z-direction) above the board-side contact surface 406.

In an embodiment, the FAI element 422 has an X-direction length of 200 micrometer (µm), a Y-direction width of 200 µm, and a Z-direction overall height of greater than 300 µm. In an embodiment, the Z-direction height of the ledge 423 is 50 µm from the bottom, the upper portion of the FAI element 422 also has a Z-direction thickness of 50 µm. The passive device 424 seated on the ledge 423, has a Z-height of 200 µm.

Figure 5:
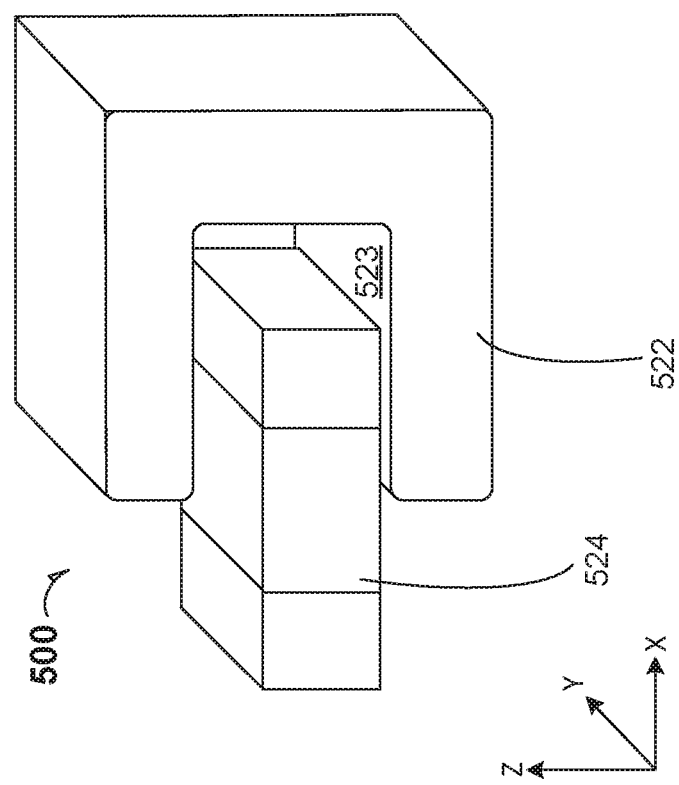
FIG. 5 is a perspective elevation of a frame-array interconnect element and passive device seated on the frame-array interconnect element according to an embodiment.

FIG. 5 is a perspective elevation 500 of a frame-array interconnect element 522 and passive device 524 seated on the frame-array interconnect element 522 according to an embodiment. An FAI element 522 is fashioned into a C-shape, from electronics-grade metal such as copper or aluminum, and a capacitor 524 is seated on a ledge portion 523.

In an embodiment, the FAI element 522 has an X-direction length of 200 micrometer (µm), a Y-direction width of 100 µm, and a Z-direction overall height of greater than 300 µm. In an embodiment, the Z-direction height of the ledge 523 is 100 µm from the bottom, the upper portion of the FAI element 522 also has a Z-direction thickness of 100 µm. The passive device 524 seated on the ledge 523, has a Z-height of 100 µm.

FIGS. 6A through 6E represent fabrication of frame-array interconnect element pairs according to several embodiments.

Figure 6A:
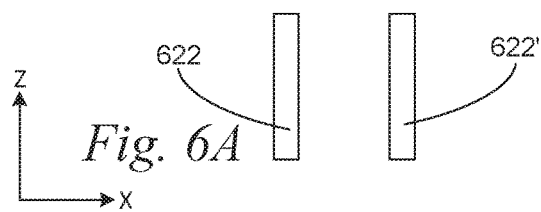
FIGS. 6A through 6E represent fabrication of frame-array interconnect element pairs according to several embodiments.

At FIG. 6A, a side elevation of a frame-array interconnect element pair is depicted during fabrication according to an embodiment. Incoming metal frame elements 622 and 622' are provided, such as an electronics-grade copper, aluminum or silver material. In an embodiment, the incoming metal frame elements are gold plated. In an embodiment, the metal frame elements 622 and 622' are provided as metallic blanks such as in obelisk form with a width-length-height form factor such as 1-4-9 with the dimensions of 1 and 9 illustrated in X-Z side elevation.

Figure 6B:
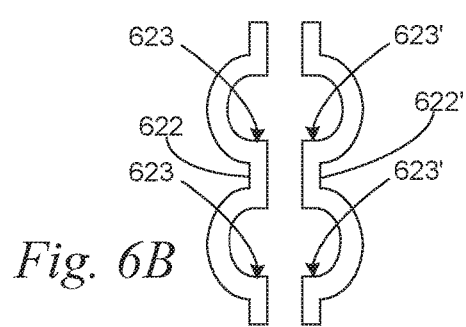

At FIG. 6B, the metal frame elements 622 and 622' have each been stamped to create at least one mounting ledge 623 and 623'. The overall Z-dimension is shortened as several bending events are worked on the metal frame elements 622 and 622'. Stamping or otherwise shaping, results in the mounting ledges 623 and 623' and the shortened overall Z-dimension height.

Figure 6C:
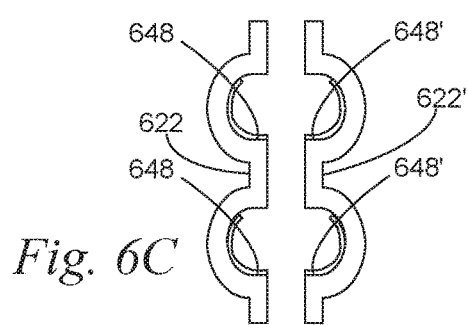

At FIG. 6C, processing includes filling an electrical interconnect conductive film such as solder layers 648 and 648' onto the mounting ledges 623 and 623' (also referred to as ledge portions 623 and 623' see FIG. 6B), for useful electrical contact with a seated passive device.

Figure 6D:
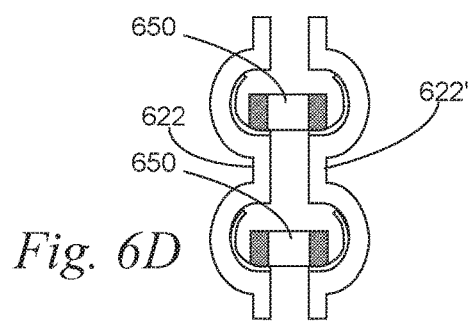

At FIG. 6D, passive devices 650 such as capacitors 650 are seated on the solder layers 648 and 648' (see FIG. 6C). In a processing embodiment, a reflow technique on the solder layers, is used to form a bonded contact between the passive devices 650 and the metal frame elements 622 and 622'.

Figure 6E:
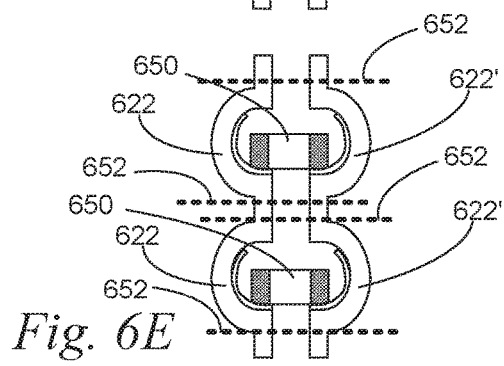

At FIG. 6E, the process includes cutting and trimming out frame-array interconnect elements, by cutting along trimming lines 652.

Figure 6:
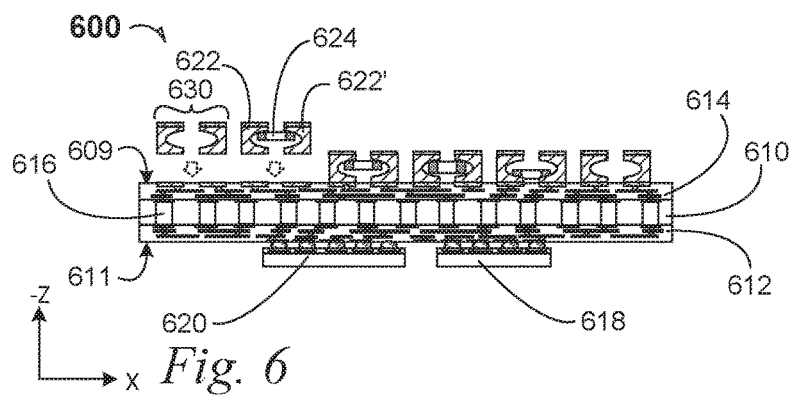
FIG. 6 is a cross-section elevation of an integrated-circuit package apparatus according to an embodiment.

FIG. 6 is a cross-section elevation of an integrated-circuit package apparatus 600 according to an embodiment. Fabrication of FAI elements 622 and 622' as illustrated in FIGS. 6A through 6E, includes seating the FAI elements 622 and 622' onto an integrated-circuit package substrate 610 on a land side 609. As illustrate, the integrated-circuit package substrate exposes the land side 609, and the integrated-circuit package substrate 610 is inverted compared to e.g. the integrated-circuit package substrate 110 depicted in FIG. 1A. The IC package substrate 610 also includes a die-side redistribution layer (RDL) 612 and a land-side RDL 614, as well as through-core interconnects 616 according to an embodiment. At least one of a first integrated-circuit (IC) device 618 and a subsequent IC device 620 are mounted on a die side 611.

In an embodiment, the first and complementary first frame-array interconnects 622 and 622' are pick-and-place seated on the land side 609, as a unit with a passive device 624. As illustrated, more frame-array interconnects are present in contact with the land side 609 of the IC package substrate 610. For example a third frame-grid array (FGA) interconnect 630 includes two elements that do not accommodate a seated passive device, such that pick-and-place techniques require two actions during assembly.

FIG. 7A is a cross-section elevation of an integrated-circuit package apparatus 700 that employs I-frame grid array interconnect according to an embodiment. An integrated-circuit package substrate 710 includes a die side 711 and a land side 709. The IC package substrate 710 includes a die-side redistribution layer (RDL) 712 and a land-side RDL 714, as well as through-core interconnects 716 according to an embodiment. At least one of a first integrated-circuit (IC) device 718 and a subsequent IC device 720 are mounted on the die side 711.

In an embodiment, a first I-frame-array interconnect includes three I-frame array interconnects (IFAIs), which are notated as 722, 722' and 722". Between the I-frame array interconnects are two passive devices 724 and 725, which are capacitors according to an embodiment. Additionally in an embodiment, two I-frame array interconnects 726 and 726' accommodate a passive device 728 such as a capacitor. Several other I-frame array interconnects are also present, which do not necessarily accommodate a passive device.

I-frame array interconnects can be identified as single I-frame array interconnect 732, or paired I-frame array interconnects 730, 734 and 736.

In an embodiment, the I-frame interconnects are assembled from three portions

In an embodiment, the land side 709 faces a board 738 such as a motherboard in a computing system, and the several IFAIs contact both the land side 709 and the board 738. In an embodiment, the board 738 has an external shell 740 that provides at least one of physical and electrical insulative protection for components on the board 738. For example, the external shell 740 is part of a hand-held computing system such as a communication device. In an embodiment, the external shell 740 is part of the exterior of a mobile computing platform such as a drone.

FIG. 7B is a top plan cut-away 701 of the integrated-circuit package apparatus 700 depicted in FIG. 7A according to an embodiment. The integrated-circuit package apparatus 701 is viewable from the section line A-A' in FIG. 7A. As illustrated, the board 738 is a seat for the IFAIs, the IFAIs 722, 722' and 722", as well as the two passive devices 724, 725 are enumerated.

Figure 8:
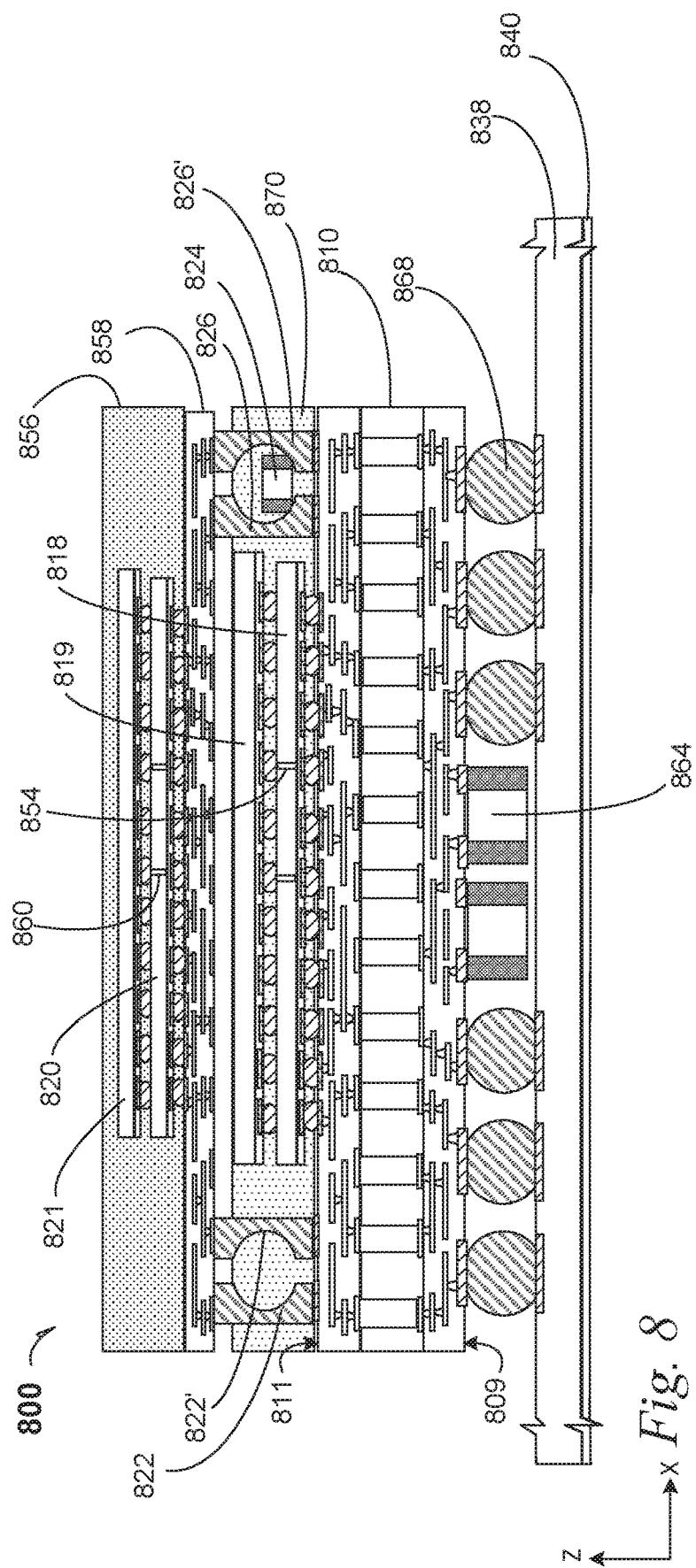
FIG. 8 is a cross-section elevation of an integrated-circuit package apparatus with a package-on-package connected through a frame-array interconnect technique according to an embodiment.

FIG. 8 is a cross-section elevation of an integrated-circuit package apparatus 800 with a package-on-package connected through a frame-array interconnect technique according to an embodiment. An integrated-circuit package substrate 810 includes a die side 811 and a land side 809.

A first stacked IC die 818 and a subsequent stacked IC die 819 are above the die side 811, with the first stacked IC die 818 being directly coupled to the die side 811, and the subsequent stacked IC die 819 being coupled to the first stacked IC die 818 by at least one through-silicon via (TSV) 854.

In an embodiment, a package-on-package (POP) assembly 856 communicates to the die side 811 through a POP redistribution layer (POP RDL) 858, by frame array interconnects. For example FAI elements 822 and 822' contact each of the die side 811 and the POP RDL 858, and no passive device is seated between the FAI elements 822 and 822'. In an embodiment, however, FAI elements 826 and 826' contact each of the die side 811 and the POP RDL 858, and the FAI elements accommodate a passive device 824 such as a first capacitor 824.

In an embodiment, a molding mass 870 is disposed above the die side 811, contacting the FAI elements 822, 822', 826 and 826', as well as the passive device 824 such as the first capacitor 824.

In an embodiment, the POP assembly 856 contains a first POP stacked IC die 820 and a subsequent POP stacked IC die 821, which are above the POP RDL 858. In an embodiment, the first POP stacked IC die 820 is directly coupled to the POP RDL 858, and the subsequent POP stacked IC die 821 is coupled to the first POP stacked IC die 820 by at least one through-silicon via (TSV) 860.

In an embodiment, a board 838 such as a motherboard 838, has an external shell 840 that provides at least one of physical and electrical insulative protection for components on the board 838. For example, the external shell 840 may be part of a hand-held computing system such as a communication device. In an embodiment, the external shell 840 is part of the exterior of a mobile computing platform such as a drone.

In an embodiment, a passive device 864 is suspended from the land side 809 and the land side 809 is coupled to the board 838 through an electrical bump 868 such as in ball-grid array.

Figure 9:
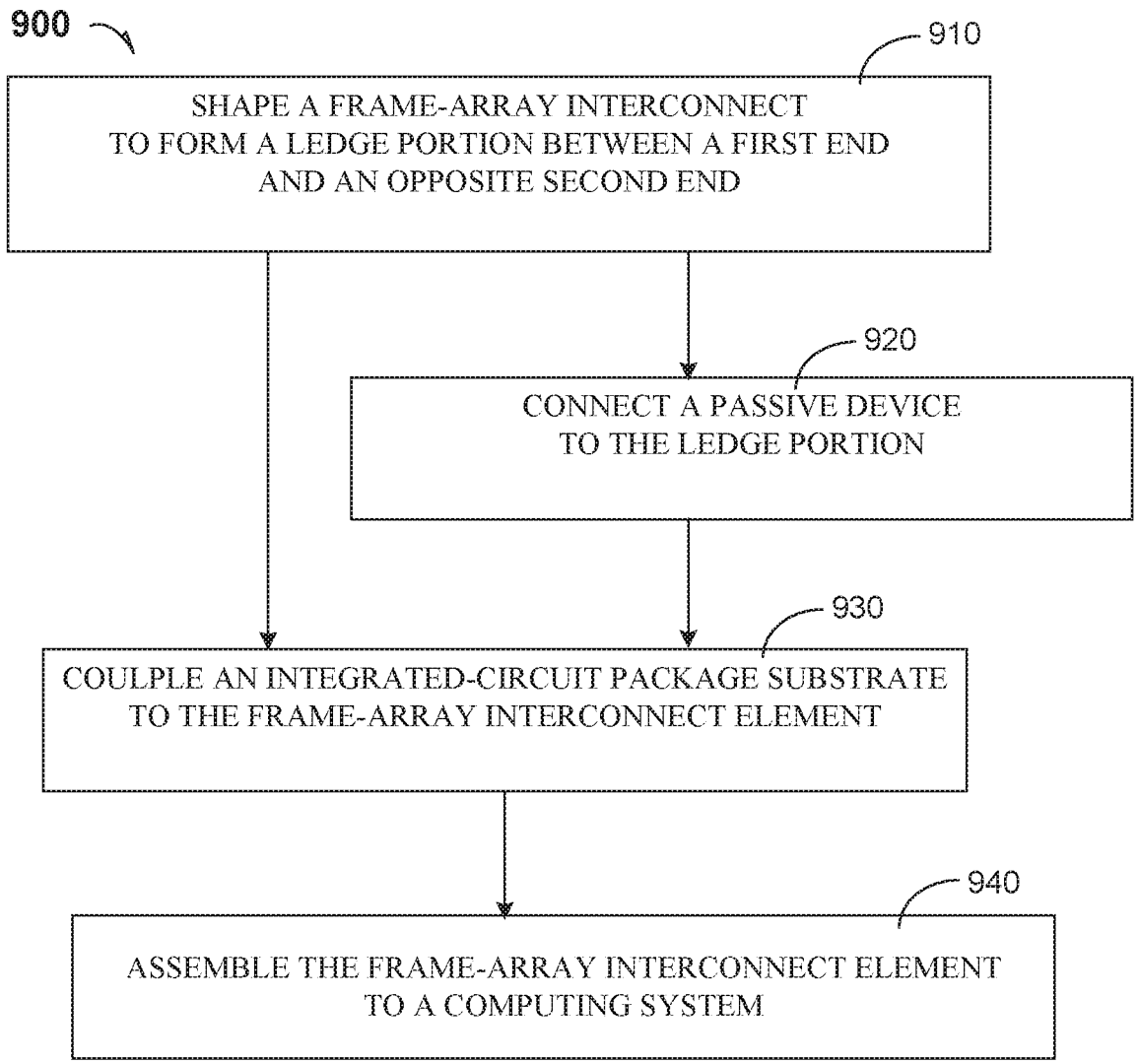
FIG. 9 is a process flow diagram according to several embodiments.

FIG. 9 is a process flow diagram according to several embodiments.

At 910, a process includes shaping a frame-array interconnect to form a ledge portion between a land-side contact surface and a board-side contact surface. In an embodiment, the shaping process includes forming the ledge portion between a first end and an opposite second end. In a non-limiting example embodiment, an electronics-grade copper metal frame element 622 in FIG. 6A, is shaped to form a ledge portion 623 in FIG. 6B.

At 920, the process includes connecting a passive device to the ledge portion. In a non-limiting example embodiment, an electronics-grade silver frame-array interconnect element 622 as depicted in FIG. 6C has a passive device 650 (FIG. 6D) seated on the solder layer 648, before cutting 652.

At 930, the process includes coupling an integrated-circuit package substrate to a board through a frame-array interconnect element. In a non-limiting example embodiment, the FAIs 622 and 622' depicted in FIG. 6, with a passive device 624, are seated on the integrated-circuit package substrate 610, followed by seating the substrate 610 on a board such as the board 138 depicted in FIG. 1A.

At 940, the process includes assembling the frame-array interconnect to a computing system.

Figure 10:
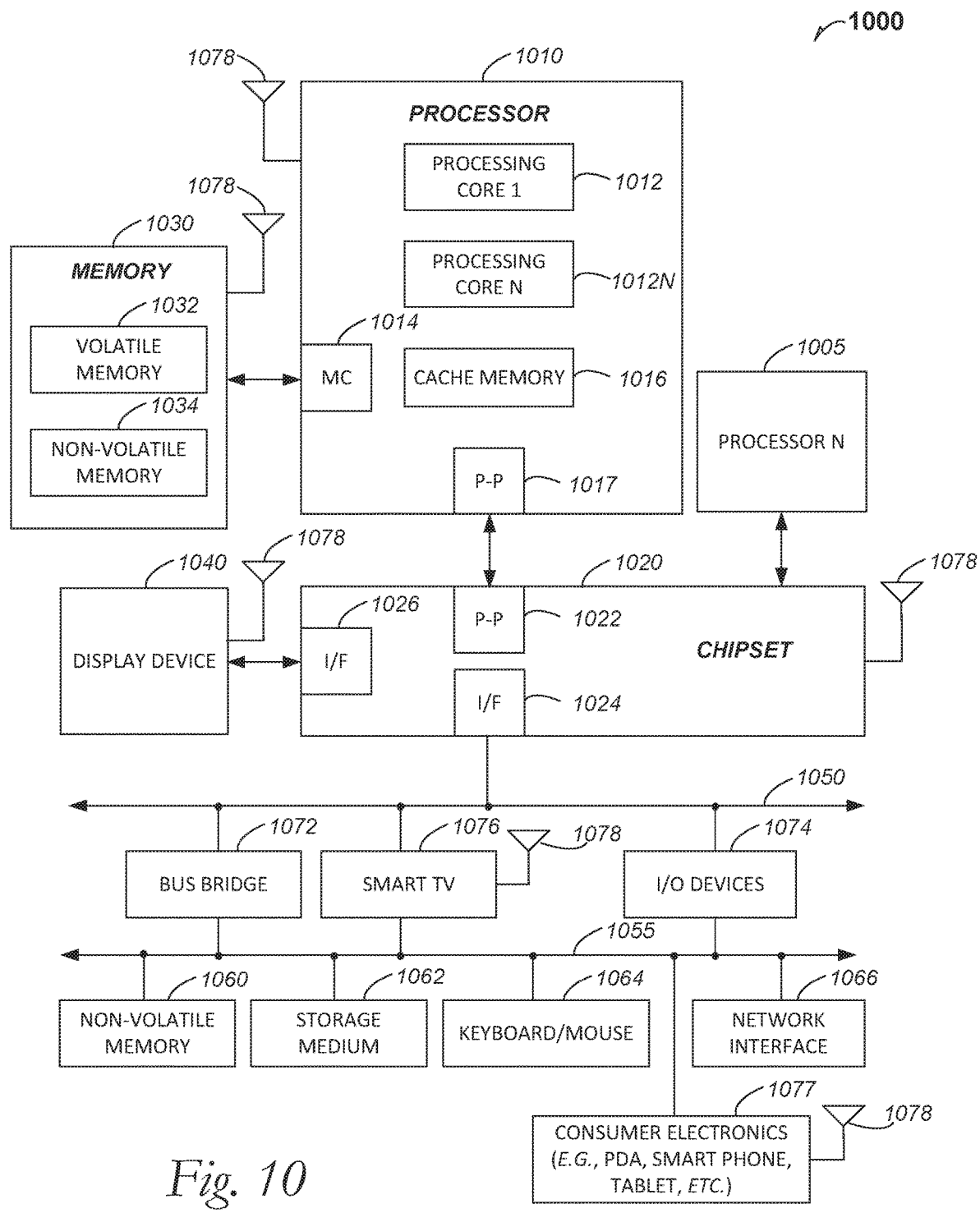
FIG. 10 is included to show an example of a higher-level device application for the disclosed embodiments.

FIG. 10 is included to show an example of a higher-level device application for the disclosed embodiments. The frame-array interconnect embodiments may be found in several parts of a computing system. In an embodiment, the frame-array interconnect embodiments can be part of a communications apparatus such as is affixed to a cellular communications tower. In an embodiment, a computing system 1000 includes, but is not limited to, a desktop computer. In an embodiment, a computing system 1000 includes, but is not limited to a laptop computer. In an embodiment, a computing system 1000 includes, but is not limited to a tablet. In an embodiment, a computing system 1000 includes, but is not limited to a notebook computer. In an embodiment, a computing system 1000 includes, but is not limited to a personal digital assistant (PDA). In an embodiment, a computing system 1000 includes, but is not limited to a server. In an embodiment, a computing system 1000 includes, but is not limited to a workstation. In an embodiment, a computing system 1000 includes, but is not limited to a cellular telephone. In an embodiment, a computing system 1000 includes, but is not limited to a mobile computing device. In an embodiment, a computing system 1000 includes, but is not limited to a smart phone. In an embodiment, a system 1000 includes, but is not limited to an internet appliance. Other types of computing devices may be configured with the microelectronic device that includes frame-array interconnect embodiments.

In an embodiment, the processor 1010 has one or more processing cores 1012 and 1012N, where 1012N represents the Nth processor core inside processor 1010 where N is a positive integer. In an embodiment, the electronic device system 1000 using a frame-array interconnect embodiment that includes multiple processors including 1010 and 1005, where the processor 1005 has logic similar or identical to the logic of the processor 1010. In an embodiment, the processing core 1012 includes, but is not limited to, pre-fetch logic to fetch instructions, decode logic to decode the instructions, execution logic to execute instructions and the like. In an embodiment, the processor 1010 has a cache memory 1016 to cache at least one of instructions and data for the frame-array interconnect element on an integrated-circuit package substrate in the system 1000. The cache memory 1016 may be organized into a hierarchal structure including one or more levels of cache memory.

In an embodiment, the processor 1010 includes a memory controller 1014, which is operable to perform functions that enable the processor 1010 to access and communicate with memory 1030 that includes at least one of a volatile memory 1032 and a non-volatile memory 1034. In an embodiment, the processor 1010 is coupled with memory 1030 and chipset 1020. In an embodiment, the chipset 1020 is part of a frame-array interconnect embodiment depicted in FIG. 1A. The processor 1010 may also be coupled to a wireless antenna 1078 to communicate with any device configured to at least one of transmit and receive wireless signals. In an embodiment, the wireless antenna interface 1078 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 1032 includes, but is not limited to, Synchronous Dynamic Random-Access Memory (SDRAM), Dynamic Random-Access Memory (DRAM), RAMBUS Dynamic Random-Access Memory (RDRAM), and/or any other type of random access memory device. The non-volatile memory 1034 includes, but is not limited to, flash memory, phase change memory (PCM), read-only memory (ROM), electrically erasable programmable read-only memory (EEPROM), or any other type of non-volatile memory device.

The memory 1030 stores information and instructions to be executed by the processor 1010. In an embodiment, the memory 1030 may also store temporary variables or other intermediate information while the processor 1010 is executing instructions. In the illustrated embodiment, the chipset 1020 connects with processor 1010 via Point-to-Point (PtP or P-P) interfaces 1017 and 1022. Either of these PtP embodiments may be achieved using a frame-array interconnect embodiment as set forth in this disclosure. The chipset 1020 enables the processor 1010 to connect to other elements in a frame-array interconnect embodiment in a system 1000. In an embodiment, interfaces 1017 and 1022 operate in accordance with a PtP communication protocol such as the Intel® QuickPath Interconnect (QPI) or the like. In other embodiments, a different interconnect may be used.

In an embodiment, the chipset 1020 is operable to communicate with the processor 1010, 1005N, the display device 1040, and other devices 1072, 1076, 1074, 1060, 1062, 1064, 1066, 1077, etc. The chipset 1020 may also be coupled to a wireless antenna 1078 to communicate with any device configured to at least do one of transmit and receive wireless signals.

The chipset 1020 connects to the display device 1040 via the interface 1026. The display 1040 may be, for example, a liquid crystal display (LCD), a plasma display, cathode ray tube (CRT) display, or any other form of visual display device. In an embodiment, the processor 1010 and the chipset 1020 are merged into a frame-array interconnect embodiment in a system. Additionally, the chipset 1020 connects to one or more buses 1050 and 1055 that interconnect various elements 1074, 1060, 1062, 1064, and 1066. Buses 1050 and 1055 may be interconnected together via a bus bridge 1072 such as at least one frame-array interconnect embodiment. In an embodiment, the chipset 1020, via interface 1024, couples with a non-volatile memory 1060, a mass storage device(s) 1062, a keyboard/mouse 1064, a network interface 1066, smart TV 1076, and the consumer electronics 1077, etc.

In an embodiment, the mass storage device 1062 includes, but is not limited to, a solid-state drive, a hard disk drive, a universal serial bus flash memory drive, or any other form of computer data storage medium. In one embodiment, the network interface 1066 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family. Home Plug AV (HPAV), Ultra Wide Band (UWB). Bluetooth, WiMax, or any form of wireless communication protocol.

While the modules shown in FIG. 10 are depicted as separate blocks within the frame-array interconnect embodiments in a computing system 1000, the functions performed by some of these blocks may be integrated within a single semiconductor circuit or may be implemented using two or more separate integrated circuits. For example, although cache memory 1016 is depicted as a separate block within processor 1010, cache memory 1016 (or selected aspects of 1016) can be incorporated into the processor core 1012.

FIG. 11 is a cross-section elevation of an integrated-circuit package apparatus 1100 that is similar to the integrated-circuit package apparatus 100 depicted in FIG. 1A according to an embodiment. Structures and devices as illustrated have been added to, by forming a molding mass 1180 within the array of several frame-array interconnects 122, 126, 130, 132, 134 and 136. Additionally, a patterned electrical film 1182 is used to couple the FAIs to the land side 109, and a patterned electrical film 1184 is used to couple the FAIs to the board 138.

FIG. 12 is a cross-section elevation of an integrated-circuit package apparatus 1200 that includes elements of the package-on-package apparatus depicted in FIG. 8, and the integrated-circuit package apparatus 1100 depicted in FIG. 11 according to an embodiment. Structures and devices as illustrated have been added to, by forming the molding mass 1180 within the array of several frame-array interconnects 122, 126, 130, 132, 134 and 136. Additionally, a patterned electrical film 1182 is used to couple the FAIs to the land side 809, and a patterned electrical film 1184 is used to couple the FAIs to the board 838.

As illustrated, the POP assembly 856 communicates to the die side 811 through a POP redistribution layer (POP RDL) 858, by frame array interconnects. For example FAI elements 822 and 822' contact each of the die side 811 and the POP RDL 858, and no passive device is seated between the FAI elements 822 and 822'. In an embodiment, however, FAI elements 826 and 826' contact each of the die side 811 and the POP RDL 858, and the FAI elements accommodate a passive device 824 such as a first capacitor 824. In an embodiment, a molding mass 870 is disposed above the die side 811, contacting the FAI elements 822, 822', 826 and 826', as well as the passive device 824 such as the first capacitor 824.

To illustrate the frame-array interconnect embodiments and methods disclosed herein, a non-limiting list of examples is provided herein:

Example 1 is a frame-array interconnect assembly, comprising: a frame-array interconnect element including a first end and a second opposite end; a ledge portion between the first end and the second opposite end; and a passive device on the ledge portion.

In Example 2, the subject matter of Example 1 optionally includes wherein a conductive film contacts the ledge portion and the passive device, and wherein the conductive film is a solder material.

In Example 3, the subject matter of any one or more of Examples 1-2 optionally include wherein the passive device is a first capacitor, further including: a subsequent frame-array interconnect on a land side of an integrated-circuit package substrate; a complementary subsequent frame-array interconnect on the land side; and a subsequent capacitor on respective ledges of the subsequent and complementary subsequent frame-array interconnects.

In Example 4, the subject matter of any one or more of Examples 1-3 optionally include wherein the passive device is a first capacitor, further including: a subsequent frame-array interconnect on a land side of an integrated-circuit package substrate; a complementary subsequent frame-array interconnect on the land side; a subsequent capacitor on respective ledges of the subsequent and complementary subsequent frame-array interconnects; a third frame-array interconnect on the land side; and a complementary third frame-array interconnect on the land side and adjacent the third frame-array interconnect.

In Example 5, the subject matter of any one or more of Examples 1-4 optionally include wherein the frame-array interconnect element is a first frame-array interconnect element, further including: a complementary first frame-array interconnect element, wherein the passive device bridges between the first frame-array interconnect element and the complementary first frame-array interconnect element, and wherein the complementary first frame-array interconnect element, is coupled to the passive device by a conductive film on a ledge portion.

In Example 6, the subject matter of any one or more of Examples 1-5 optionally include wherein the frame-array interconnect element is in a grid of a plurality of frame-array interconnect elements that are in a rectangular grid layout on a land side of an integrated-circuit package substrate, wherein the integrated-circuit package substrate includes a die side opposite the land side.

In Example 7, the subject matter of any one or more of Examples 1-6 optionally include wherein the frame-array interconnect element is in a grid of a plurality of frame-array interconnect elements that are in a rectangular grid layout on a land side of an integrated-circuit package substrate, wherein the integrated-circuit package substrate includes a die side opposite the land side, further including: an integrated-circuit die on the die side, wherein the passive device is coupled through the integrated-circuit package substrate to the integrated-circuit die.

In Example 8, the subject matter of any one or more of Examples 1-7 optionally include wherein the frame-array interconnect element is in a grid of a plurality of frame-array interconnect elements that are in a rectangular grid layout on a land side of an integrated-circuit package substrate, wherein the integrated-circuit package substrate includes a die side opposite the land side, further including: an integrated-circuit die on the die side, wherein the passive device is coupled through the integrated-circuit package substrate to the integrated-circuit die; and a molding mass contacting at least some of the frame-array interconnect elements and at least on passive device.

In Example 9, the subject matter of any one or more of Examples 1-8 optionally include wherein the frame-array interconnect element is in a grid of a plurality of frame-array interconnect elements that are in a rectangular grid layout on a land side of an integrated-circuit package substrate, wherein the integrated-circuit package substrate includes a die side opposite the land side, further including: a first integrated-circuit die on the die side, wherein the passive device is coupled through the integrated-circuit package substrate to the first integrated-circuit die; and.

In Example 10, the subject matter of any one or more of Examples 1-9 optionally include wherein the frame-array interconnect element is a first frame-array interconnect element, further including: a complementary first frame-array interconnect element, wherein the passive device bridges between the first frame-array interconnect element and the complementary first frame-array interconnect element, and wherein the complementary first frame-array interconnect element, is coupled to the passive device by a conductive film on a ledge portion; wherein the frame-array interconnect element is in a grid of a plurality of frame-array interconnect elements that are in a rectangular grid layout on a land side of an integrated-circuit package substrate; a second frame-array interconnect element on the land side including a ledge portion, wherein the passive device also bridges to the second frame-array interconnect element.

In Example 11, the subject matter of any one or more of Examples 1-10 optionally include wherein the frame-array interconnect element is a first frame-array interconnect element, further including: a complementary first frame-array interconnect element, wherein the passive device bridges between the first frame-array interconnect element and the complementary first frame-array interconnect element, and wherein the complementary first frame-array interconnect element, is coupled to the passive device by a conductive film on a ledge portion; wherein the frame-array interconnect element is in a grid of a plurality of frame-array interconnect elements that are in a rectangular grid layout on a land side of an integrated-circuit package substrate; a second frame-array interconnect element on the land side including a ledge portion, wherein the second frame-array interconnect element is orthogonal to the rectangular grid layout.

In Example 12, the subject matter of any one or more of Examples 1-11 optionally include wherein the frame-array interconnect element is a first frame-array interconnect element, further including: a complementary first frame-array interconnect element, wherein the passive device bridges between the first frame-array interconnect element and the complementary first frame-array interconnect element, and wherein the complementary first frame-array interconnect element, is coupled to the passive device by a conductive film on a ledge portion; wherein the frame-array interconnect element is in a grid of a plurality of frame-array interconnect elements that are in a rectangular grid layout on a land side of an integrated-circuit package substrate; a second frame-array interconnect element on the land side including a ledge portion, wherein the second frame-array interconnect element is oblique to the rectangular grid layout.

In Example 13, the subject matter of any one or more of Examples 1-12 optionally include wherein the frame-array interconnect element is a first frame-array interconnect element, further including: a complementary first frame-array interconnect element, wherein the passive device bridges between the first frame-array interconnect element and the complementary first frame-array interconnect element, and wherein the complementary first frame-array interconnect element, is coupled to the passive device by a conductive film on a ledge portion, and wherein the respective and complementary first frame-array interconnect elements each have an I-frame form factor.

Example 14 is an integrated circuit package, comprising: a first integrated-circuit die on a die side of an integrated-circuit package substrate; a first frame-array interconnect element including a first end and a second opposite end; a ledge portion between the first end and the second opposite end; a conductive film on the ledge portion; a first complementary frame-array interconnect on the die side and adjacent the first frame-array interconnect; a passive device contacting the conductive film and a conductive film on the first complementary frame-array interconnect; and a molding mass above the die side and contacting the frame-array interconnects and the passive device.

In Example 15, the subject matter of Example 14 optionally includes a subsequent frame-array interconnect on the die side and contacting the molding mass; and a complementary subsequent frame-array interconnect on the die side and adjacent the subsequent frame-array interconnect, wherein the complementary subsequent frame-array interconnect contacts the molding mass.

In Example 16, the subject matter of any one or more of Examples 14-15 optionally include a subsequent frame-array interconnect on the die side and contacting the molding mass; a complementary subsequent frame-array interconnect on the die side and adjacent the subsequent frame-array interconnect, wherein the complementary subsequent frame-array interconnect contacts the molding mass; a package contacting the first and subsequent frame-array interconnects; and a subsequent stacked integrated-circuit die in the package, wherein the subsequent stacked integrated-circuit die is coupled to the first and subsequent frame interconnects, through a redistribution layer in the package.

In Example 17, the subject matter of any one or more of Examples 14-16 optionally include a subsequent frame-array interconnect on the die side and contacting the molding mass; a complementary subsequent frame-array interconnect on the die side and adjacent the subsequent frame-array interconnect, wherein the complementary subsequent frame-array interconnect contacts the molding mass a board coupled to the integrated-circuit package substrate on a land side that is opposite the die side.

In Example 18, the subject matter of any one or more of Examples 14-17 optionally include wherein the conductive film is a solder that contacts the ledge portion and the passive device.

Example 19 is a method of assembling an integrated-circuit package substrate, comprising: shaping a first frame-array interconnect to form a ledge portion between a first end and an opposite second end; forming a first electrical interconnect on the ledge portion; shaping a complementary frame-array interconnect to form a complementary first ledge portion between a first end and a second end; forming a complementary first electrical interconnect on the complementary first ledge portion; and connecting a passive device on the respective first and complementary first ledge portions.

In Example 20, the subject matter of Example 19 optionally includes assembling the first frame-array interconnect to an integrated-circuit package substrate on a die side.

In Example 21, the subject matter of any one or more of Examples 19-20 optionally include assembling the first frame-array interconnect to an integrated-circuit package substrate on a land side.

In Example 22, the subject matter of any one or more of Examples 19-21 optionally include assembling the first frame-array interconnect to an integrated-circuit package substrate on a land side; assembling an integrated-circuit die to the integrated-circuit package substrate on a die side opposite the land side.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A frame-array interconnect assembly, comprising:
   a first frame-array interconnect element including a first end and a second opposite end;
   a ledge portion between the first end and the second opposite end, wherein the ledge portion includes a C-shaped portion between the first end and the second opposite end;
   a passive device on the ledge portion; and
   a complementary first frame-array interconnect element, wherein the passive device bridges between the first frame-array interconnect element and the complementary first frame-array interconnect element, and wherein the complementary first frame-array interconnect element, is coupled to the passive device by a conductive film on a complimentary ledge portion.

2. The frame-array interconnect assembly of claim 1, wherein a conductive film contacts the ledge portion and the passive device, and wherein the conductive film is a solder material.

3. The frame-array interconnect assembly of claim 1, wherein the passive device is a first capacitor, further including:
   a subsequent frame-array interconnect on a land side of an integrated-circuit package substrate;
   a complementary subsequent frame-array interconnect on the land side; and
   a subsequent capacitor on respective ledges of the subsequent and complementary subsequent frame-array interconnects.

4. The frame-array interconnect assembly of claim 1, wherein the passive device is a first capacitor, further including:
   a subsequent frame-array interconnect on a land side of an integrated-circuit package substrate;
   a complementary subsequent frame-array interconnect on the land side;
   a subsequent capacitor on respective ledges of the subsequent and complementary subsequent frame-array interconnects;
   a third frame-array interconnect on the land side; and
   a complementary third frame-array interconnect on the land side and adjacent the third frame-array interconnect.

5. The frame-array interconnect assembly of claim 1, wherein the frame-array interconnect element is in a grid of a plurality of frame-array interconnect elements that are in a rectangular grid layout on a land side of an integrated-circuit package substrate, wherein the integrated-circuit package substrate includes a die side opposite the land side.

6. The frame-array interconnect assembly of claim 1, wherein the frame-array interconnect element is in a grid of a plurality of frame-array interconnect elements that are in a rectangular grid layout on a land side of an integrated-circuit package substrate, wherein the integrated-circuit package substrate includes a die side opposite the land side, further including:
   an integrated-circuit die on the die side, wherein the passive device is coupled through the integrated-circuit package substrate to the integrated-circuit die.

7. The frame-array interconnect assembly of claim 1, wherein the frame-array interconnect element is in a grid of a plurality of frame-array interconnect elements that are in a rectangular grid layout on a land side of an integrated-circuit package substrate, wherein the integrated-circuit package substrate includes a die side opposite the land side, further including:
   an integrated-circuit die on the die side, wherein the passive device is coupled through the integrated-circuit package substrate to the integrated-circuit die; and
   a molding mass contacting at least some of the frame-array interconnect elements and at least one passive device.

8. The frame-array interconnect assembly of claim 1, wherein the frame-array interconnect element is in a grid of a plurality of frame-array interconnect elements that are in a rectangular grid layout on a land side of an integrated-circuit package substrate, wherein the integrated-circuit package substrate includes a die side opposite the land side, further including:
   a first integrated-circuit die on the die side, wherein the passive device is coupled through the integrated-circuit package substrate to the first integrated-circuit die; and
   a subsequent integrated-circuit die on the die side, wherein the subsequent integrated-circuit is coupled through the integrated-circuit package substrate to a frame-array interconnect on the land side.

9. The frame-array interconnect assembly of claim 1, wherein the frame-array interconnect element is a first frame-array interconnect element, further including:
   a complementary first frame-array interconnect element, wherein the passive device bridges between the first frame-array interconnect element and the complementary first frame-array interconnect element, and wherein the complementary first frame-array interconnect element, is coupled to the passive device by a conductive film on a ledge portion;
   wherein the frame-array interconnect element is in a grid of a plurality of frame-array interconnect elements that are in a rectangular grid layout on a land side of an integrated-circuit package substrate;
   a second frame-array interconnect element on the land side including a ledge portion, wherein the passive device also bridges to the second frame-array interconnect element.

10. The frame-array interconnect assembly of claim 1, wherein the frame-array interconnect element is a first frame-array interconnect element, further including:
    a complementary first frame-array interconnect element, wherein the passive device bridges between the first frame-array interconnect element and the complementary first frame-array interconnect element, and wherein the complementary first frame-array interconnect element, is coupled to the passive device by a conductive film on a ledge portion;
    wherein the frame-array interconnect element is in a grid of a plurality of frame-array interconnect elements that are in a rectangular grid layout on a land side of an integrated-circuit package substrate;

a second frame-array interconnect element on the land side including a ledge portion, wherein the second frame-array interconnect element is orthogonal to the rectangular grid layout.

11. The frame-array interconnect assembly of claim 1, wherein the frame-array interconnect element is a first frame-array interconnect element, further including:
 a complementary first frame-array interconnect element, wherein the passive device bridges between the first frame-array interconnect element and the complementary first frame-array interconnect element, and wherein the complementary first frame-array interconnect element, is coupled to the passive device by a conductive film on a ledge portion;
 wherein the frame-array interconnect element is in a grid of a plurality of frame-array interconnect elements that are in a rectangular grid layout on a land side of an integrated-circuit package substrate;
 a second frame-array interconnect element on the land side including a ledge portion, wherein the second frame-array interconnect element is oblique to the rectangular grid layout.

12. The frame-array interconnect assembly of claim 1, wherein the frame-array interconnect element is a first frame-array interconnect element, further including:
 a complementary first frame-array interconnect element, wherein the passive device bridges between the first frame-array interconnect element and the complementary first frame-array interconnect element, and wherein the complementary first frame-array interconnect element, is coupled to the passive device by a conductive film on a ledge portion, and wherein the respective and complementary first frame-array interconnect elements each have an I-frame form factor.

13. An integrated circuit package, comprising:
 a first integrated-circuit die on a die side of an integrated-circuit package substrate;
 a first frame-array interconnect element including a first end and a second opposite end;
 a ledge portion between the first end and the second opposite end;
 a conductive film on the ledge portion;
 a first complementary frame-array interconnect on the die side and adjacent the first frame-array interconnect;
 a passive device contacting the conductive film and a conductive film on the first complementary frame-array interconnect; and
 a molding mass above the die side and contacting the frame-array interconnects and the passive device.

14. The integrated circuit package of claim 13, further including:
 a subsequent frame-array interconnect on the die side and contacting the molding mass; and
 a complementary subsequent frame-array interconnect on the die side and adjacent the subsequent frame-array interconnect, wherein the complementary subsequent frame-array interconnect contacts the molding mass.

15. The integrated circuit package of claim 13, further including:
 a subsequent frame-array interconnect on the die side and contacting the molding mass;
 a complementary subsequent frame-array interconnect on the die side and adjacent the subsequent frame-array interconnect, wherein the complementary subsequent frame-array interconnect contacts the molding mass;
 a package contacting the first and subsequent frame-array interconnects; and
 a subsequent stacked integrated-circuit die in the package, wherein the subsequent stacked integrated-circuit die is coupled to the first and subsequent frame interconnects, through a redistribution layer in the package.

16. The integrated circuit package of claim 13, further including:
 a subsequent frame-array interconnect on the die side and contacting the molding mass;
 a complementary subsequent frame-array interconnect on the die side and adjacent the subsequent frame-array interconnect, wherein the complementary subsequent frame-array interconnect contacts the molding mass
 a board coupled to the integrated-circuit package substrate on a land side that is opposite the die side.

17. The integrated circuit package of claim 13, wherein the conductive film is a solder that contacts the ledge portion and the passive device.

* * * * *